United States Patent
Kim et al.

(10) Patent No.: US 8,265,445 B2
(45) Date of Patent: Sep. 11, 2012

(54) PRINTED CIRCUIT BOARD FOR OPTICAL WAVEGUIDE AND METHOD OF MANUFACTURING THE SAME

(75) Inventors: Joon Sung Kim, Gyunggi-do (KR); Sang Hoon Kim, Gyunggi-do (KR); Jae Hyun Jung, Gyunggi-do (KR); Han Seo Cho, Daejeon (KR)

(73) Assignee: Samsung Electro-Mechanics Co., Ltd., Suwon (KR)

(*) Notice: Subject to any disclaimer, the term of this patent is extended or adjusted under 35 U.S.C. 154(b) by 0 days.

(21) Appl. No.: 13/419,826

(22) Filed: Mar. 14, 2012

(65) Prior Publication Data

US 2012/0171624 A1 Jul. 5, 2012

Related U.S. Application Data

(62) Division of application No. 12/155,755, filed on Jun. 9, 2008, now Pat. No. 8,160,417.

(30) Foreign Application Priority Data

Mar. 12, 2008 (KR) .................. 10-2008-0022923

(51) Int. Cl.
*G02B 6/10* (2006.01)
*C03B 37/022* (2006.01)

(52) U.S. Cl. .......................... 385/132; 65/386
(58) Field of Classification Search ................ 385/132; 65/386
See application file for complete search history.

(56) References Cited

U.S. PATENT DOCUMENTS

| | | | |
|---|---|---|---|
| 6,615,614 B1 * | 9/2003 | Makikawa et al. | 65/386 |
| 7,039,288 B2 * | 5/2006 | Wang et al. | 385/132 |
| 2002/0150368 A1 | 10/2002 | Imoto | |
| 2006/0188207 A1 | 8/2006 | Jung et al. | |
| 2006/0266081 A1 * | 11/2006 | M'Saad et al. | 65/386 |

OTHER PUBLICATIONS

U.S. Patent Restriction Requirement mailed Dec. 26, 2008 issued in corresponding U.S. Appl. No. 12/155,755.
U.S. Patent Office Action mailed Feb. 23, 2009 issued in corresponding U.S. Appl. No. 12/155,755.
U.S. Patent Final Office Action mailed Sep. 2, 2009 issued in corresponding U.S. Appl. No. 12/155,755.
U.S. Patent Office Action mailed Dec. 17, 2009 issued in corresponding U.S. Appl. No. 12/155,755.
U.S. Patent Final Office Action mailed Jun. 23, 2010 issued in corresponding U.S. Appl. No. 12/155,755.
U.S. Patent Office Action mailed Jul. 21, 2011 issued in corresponding U.S. Appl. No. 12/155,755.
U.S. Patent Notice of Allowance mailed Jan. 4, 2012 issued in corresponding U.S. Appl. No. 12/155.755.
U.S. Appl. No. 12/155,755, filed Jun. 9, 2008, Joon Sung Kim et al., Samsung Electro-Mechanics Co., Ltd.

* cited by examiner

*Primary Examiner* — Jerry Rahll

(57) ABSTRACT

Disclosed herein is a printed circuit board for an optical waveguide, including a base board, and an optical waveguide formed on the base board. The optical waveguide includes a lower clad layer formed on the base board, an insulation layer formed on the lower clad layer and having a core-forming through-hole, a core part formed on a region of the lower clad layer, which is exposed through the through-hole, and an upper clad layer formed in the through-hole and on the insulation layer.

14 Claims, 12 Drawing Sheets

PRINTED CIRCUIT BOARD FOR OPTICAL WAVEGUIDE AND METHOD OF MANUFACTURING THE SAME

CROSS-REFERENCE TO RELATED APPLICATIONS

This application is a U.S. divisional application filed under 37 CFR 1.53(b) claiming priority benefit of U.S. Ser. No. 12/155,755 filed in the United States on Jun. 9, 2008 now U.S. Pat. No. 8,160,417, which claims earlier priority benefit to Korean Patent Application No. 10-2008-0022923 filed with the Korean Intellectual Property Office on Mar. 12, 2008 the disclosures of which are incorporated herein by reference.

BACKGROUND

1. Field

The present invention relates to a printed circuit board for an optical waveguide and a method of manufacturing the same, and more particularly to a printed circuit board for an optical waveguide and a method of manufacturing the same, which is capable of being used to efficiently manufacture an optical waveguide using a relatively small amount of core material, compared to a conventional process, by locally applying core material only on the area of a lower clad layer, which is exposed through a through-hole of an insulation layer, and forming a core part through patterning.

2. Description of the Related Art

These days, the demand for optical substrates, including various wirings, which enable electrical signals or optical signals to be transmitted to mobile devices or network devices requiring high-speed data transmission, is rapidly increasing.

Optical transmission wires, which are typically produced using polymer material having low light transmission, are each comprised of a core part, through which signals are transmitted and which has a square section having a thickness of 50 μm, and a clad part, enveloping the core part. The square sectional core part is typically manufactured using a photo-etching technique.

Referring to FIGS. 4A to 4C, a conventional method of manufacturing a printed circuit board for an optical waveguide will be described.

First, a flexible substrate is comprised of a copper layer 11 and a polyimide layer 12, and a lower clad layer 13 and a core layer 14 are sequentially formed on the polyimide layer 12 of the flexible substrate (see FIG. 4A).

Then, the core layer 14 is patterned through a typical photo-etching process, to thus form a core part 14a (see FIG. 4B).

Finally, an upper clad layer 15 is formed on the lower clad layer 13, on which the core part 14a is formed, thus providing a printed circuit board for an optical waveguide (see FIG. 4C).

According to the above-described conventional method, a core material is applied to the entire work surface of the substrate, to thus form the core layer 14, and the core material is patterned through light exposure and development, to thus form the core part 14a. Accordingly, the conventional method has a disadvantage in that a relatively large amount of core material is removed, compared to the amount required for formation of the core part 14a, thus increasing material costs. In particular, taking into consideration the high cost of optical wiring material, an economic and efficient method that is capable of being used to manufacture an optical substrate is desperately required.

SUMMARY

Accordingly, the present inventor has made extensive studies to solve the above-described problems occurring in the prior art, and, as a result, has found a method of efficiently manufacturing an optical waveguide using a relatively small amount of core material, compared to a conventional process, by locally applying core material only on the area of a lower clad layer, which is exposed through a through-hole of an insulation layer, and forming a core part through patterning. Based on the finding, the present invention is accomplished.

Accordingly, in an aspect, the present invention provides a printed circuit board for an optical waveguide and a method of manufacturing the printed circuit board, which is capable of minimizing the amount of core material that is removed by the patterning in the formation of the core part.

In another aspect, the present invention provides a method of efficiently manufacturing a printed circuit board for an optical waveguide with a high degree of freedom in the selection of materials.

In a further aspect, the present invention provides a method of efficiently manufacturing a printed circuit board for an optical waveguide, which has high reliability.

According to an aspect, the present invention provides a printed circuit board for an optical waveguide, including: a base board; and an optical waveguide formed on the base board, wherein the optical waveguide includes: a lower clad layer formed on the base board; an insulation layer formed on the lower clad layer and having a core-forming through-hole; a core part formed on a region of the lower clad layer, which is exposed through the through-hole; and an upper clad layer formed in the through-hole and on the insulation layer.

The base board may include any one of a metal layer for forming a circuit, a rigid printed circuit board, a flexible printed circuit board and a rigid-flexible printed circuit board.

The insulation layer may be selected from a group consisting of a thermosetting resin, a thermoplastic resin, a reinforcing material-impregnated thermosetting resin, a reinforcing material-impregnated thermoplastic resin, and a combination thereof.

The core part may include a plurality of core patterns, and the core part may have a height equal to or higher than a height of the insulation layer.

According to another aspect, the present invention provides a method of manufacturing a printed circuit board for an optical waveguide, including: forming a lower clad layer on a base board; forming an insulation layer, having a core-forming through-hole therein, on the lower clad layer; filling the through-hole in the insulation layer with a core material; forming a core part by patterning the core material received in the through-hole; and forming an upper clad layer in the through-hole and on the insulation layer.

The forming the core part may include: layering a transparent releasable film on the insulation layer having the through-hole filled with the core material, to thus flatten the core material; selectively exposing the core material through a pattern mask; and removing the transparent releasable film and developing the exposed core material, thus forming a plurality of core patterns.

The transparent releasable film may include polyethylene terephthalate.

According to an embodiment, the forming an insulation layer may include: layering the insulation layer on the lower clad layer; and removing a portion of the insulation layer to form the core-forming through-hole.

According to another embodiment, the forming an insulation layer may include: preparing the insulation layer; removing a portion of the insulation layer to form the core-forming through-hole; and layering the insulation layer having the core-forming through-hole on the lower clad layer.

According to a further aspect, the present invention provides a method of manufacturing a printed circuit board for an optical waveguide, including: forming a lower clad layer on a base board; forming a molding film, having a core-forming through-hole therein, on the lower clad layer; filling the through-hole in the molding film with a core material; forming a core part by patterning the core material received in the through-hole; removing the molding film; and forming an upper clad layer on the lower clad layer such that the upper clad layer surrounds the core part.

The forming a core part may include: layering a transparent releasable film on the molding film having the through-hole filled with the core material, to thus flatten the core material; selectively exposing the core material through a pattern mask; and removing the transparent releasable film and developing the exposed core material, thus forming a plurality of core patterns.

The forming a molding film may include: layering the molding film on the lower clad layer; and removing a portion of the molding film to form the core-forming through-hole.

The molding film may include a photo-sensitive resist film or a releasable film.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF EMBODIMENTS

This invention will be described in further detail with reference to examples and to the accompanying drawings, but the present invention is not limited to this description.

FIGS. 1A to 1J are process views illustrating a method of manufacturing a printed circuit board for an optical waveguide, according to a first preferred embodiment of the present invention, FIGS. 2A to 2I are process views illustrating a method of manufacturing a printed circuit board for an optical waveguide, according to a second preferred embodiment of the present invention, and FIGS. 3A to 3K are process views illustrating a method of manufacturing a printed circuit board for an optical waveguide, according to a third preferred embodiment of the present invention.

Referring to FIGS. 1A to 1J, a method of manufacturing a printed circuit board for an optical waveguide, according to a first preferred embodiment of the present invention, is described.

Figure 1A:
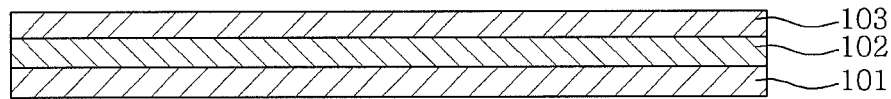
FIGS. 1A to 1J are process views illustrating a method of manufacturing a printed circuit board for an optical waveguide, according to a first preferred embodiment of the present invention.
Figure 1B:
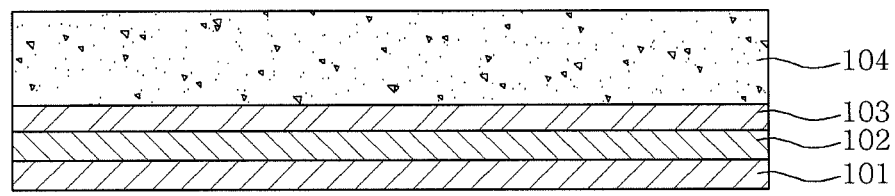

First, a flexible copper clad laminate functioning as a base board is comprised of a copper layer 101 and a polyimide layer 102, and a lower clad layer 103 is formed on the polyimide layer 102 of the flexible copper clad laminate (see FIG. 1A).

Although the flexible copper clad laminate is illustrated as a base board in these drawings, which incorporated the polyimide layer therein as an insulation layer, the material of the base board is not particularly limited to the flexible copper clad laminate. In this case, a circuit-forming metal layer, such as a copper thin film, may be directly applied, or other flexible copper clad laminate, rigid copper clad laminate or rigid-flexible copper clad laminate, which is dominantly used in the field of the printed circuit board, may be applied if necessary. Further, as the base board, a flexible printed circuit board, a rigid printed circuit board or a rigid-flexible printed circuit board, in which one or more circuit layers are previously formed, may be used.

Although the lower clad layer 103 is typically prepared by layering a usual clad film on the base board, the lower clad layer is not particularly limited thereto, and may be prepared using any of the commonly-known processes such as a coating.

Figure 1C:
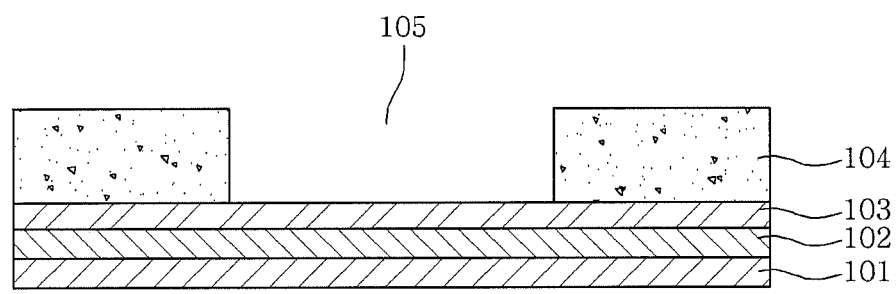

Then, an insulation layer 104 is formed on the lower clad layer 103 (see FIG. 1B), and a portion of the insulation layer 104 is removed, to thus form a through-hole 105, in which a core is to be formed (see FIG. 1C).

The insulation layer 104 may be made of one of thermosetting resin, thermoplastic resin, reinforcing material-impregnated thermosetting resin and reinforcing material-impregnated thermoplastic resin, or a combination of two or more thereof. Concrete examples of the insulation layer 104 may include a prepreg, a polyimide film and a photo-sensitive insulation material, but the invention is not particularly limited to the above-listed materials.

The process of forming the through-hole 105 in the insulation layer 104 is not particularly limited, but may be suitably selected depending on the material of the insulation layer that is actually used. For example, the through-hole 105 may be formed through a photo-etching process using light exposure/development, a laser machining process or the like.

Figure 1D:
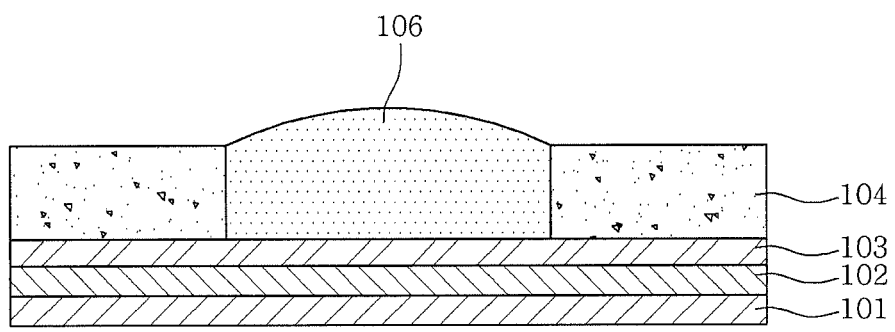

Subsequently, the through-hole 105 of the insulation layer 104 is filled with a core material 106 (see FIG. 1D).

The filling operation of the through-hole 105 with the core material 106 may be conducted using any of processes known in the art, such as dispensing, ink jetting and printing, and the core material 106 charged in the through-hole 105 may be cured using a pre-baking process. However, the process of preparing the core material 106 is not particularly limited to these. The core material 106, which is charged in the through-hole through the above-described process, may bulge upwards to be convex, depending on the kind and the charging amount of the core material.

Figure 1E:
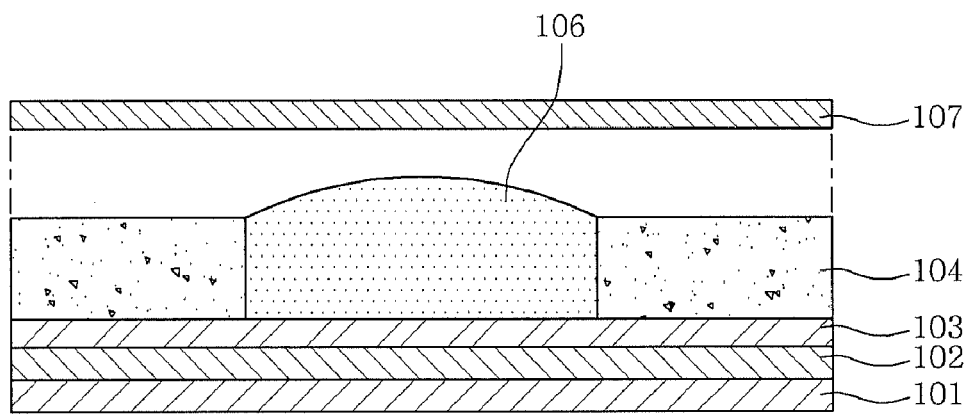
Figure 1E:
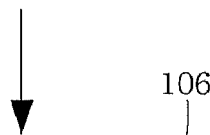
Figure 1E:
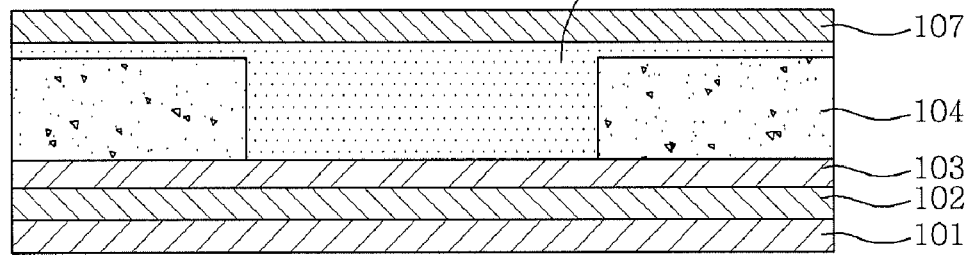
Figure 1F:
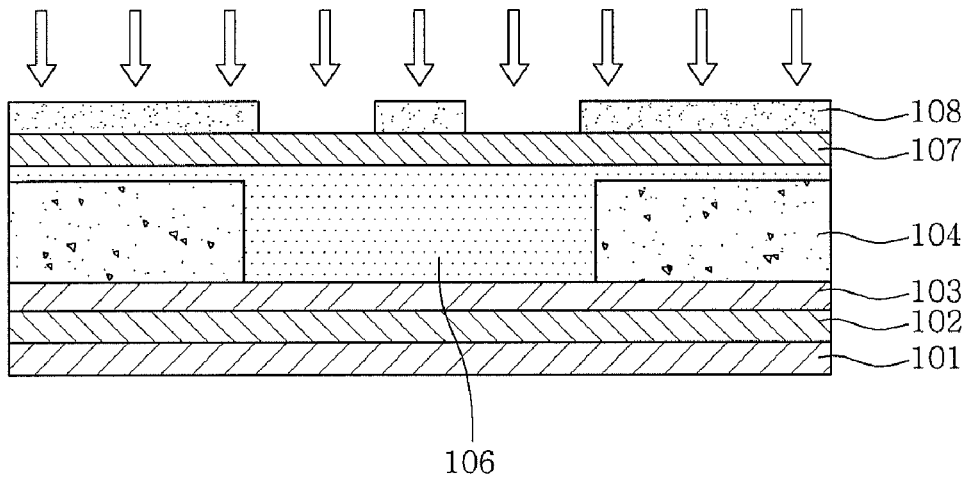
Figure 1G:
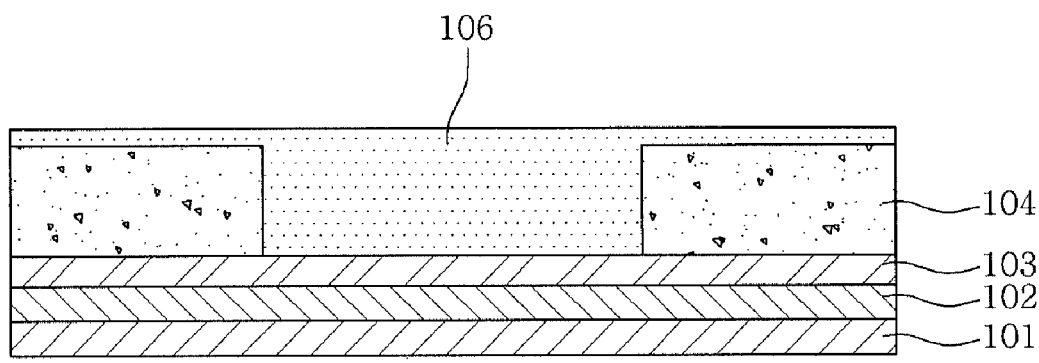
Figure 1H:
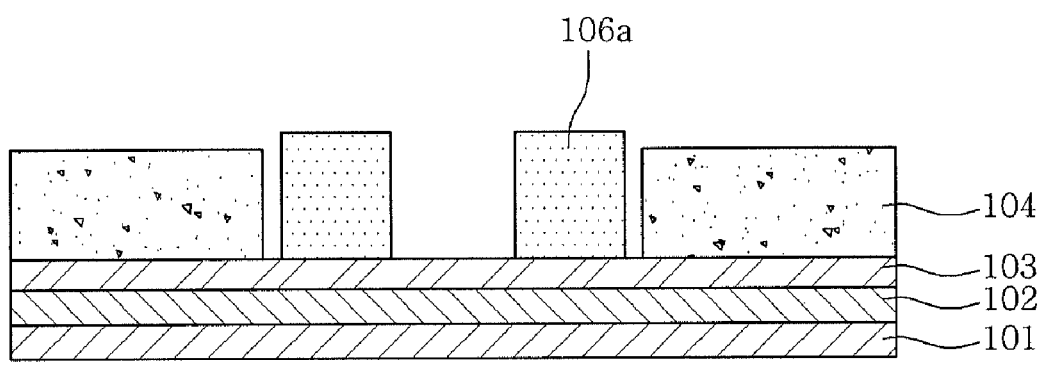

Then, the core material 106 charged in the through-hole 105 is subjected to a patterning process, thus forming a core part 106a (see FIG. 1H).

In the preferred embodiment, the formation of the core part 106a may be conducted in the manner described below.

First, a transparent releasable film 107 is layered on the insulation layer 104, having the through-hole 105 filled with the core material 106, in the vacuum atmosphere, so that the core material 106 charged in the through-hole 105 is flattened (see FIG. 1E). As the transparent releasable film 107 used in this process, any material that functions to prevent contamination caused by extraneous substances and to flatten the core material, and that further functions to allow the transmission of light in the subsequent light exposure process and to allow easy elimination thereof after the light exposure, may be used without limitation. For example, polyethylene terephthalate (PET) may be preferably used.

Then, a pattern mask 108 having a predetermined patterning shape is placed on the transparent releasable film 107, so as to selectively expose the core material 106 to light (see FIG. 1F). At this point, post exposure baking (PEB) may be optionally conducted before or after the light exposure, if necessary.

Subsequently, the transparent releasable film 107 is removed (see FIG. 1G), and the core material 106, which is exposed to light, is developed, to thus form a plurality of core parts 106a (see FIG. 1H). The core parts 106a, which are obtained using the above processes, may have a height which is equal to or higher than the height of the insulation layer 104, depending on the results of the charging of the core material and the flattening process.

Figure 1I:
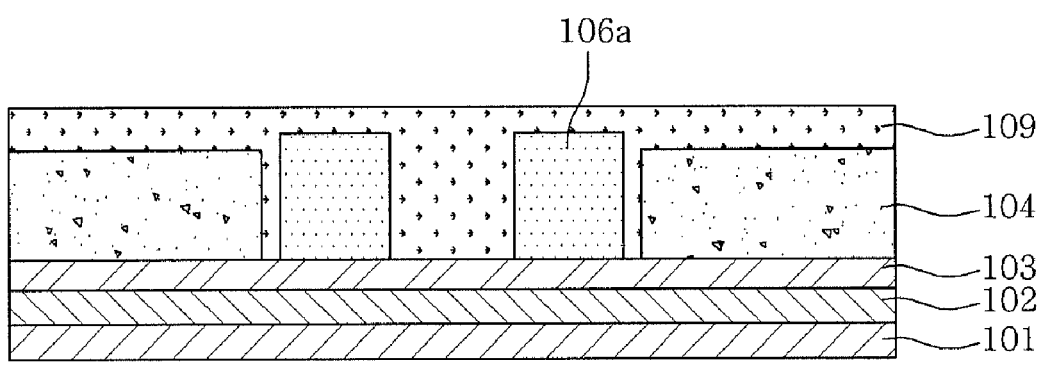
Figure 1J:
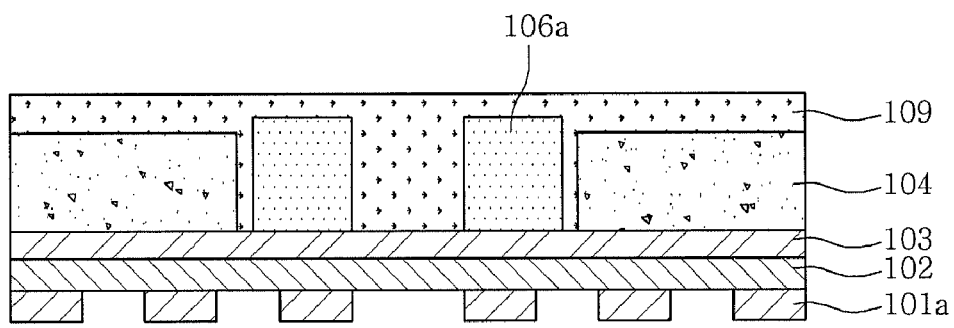

Finally, an upper clad layer 109 is applied in the rest through-hole 105 except for the core part 106a and on the insulation layer 104 (see FIG. 1I). Thereafter, the copper layer 101 of the flexible copper clad laminate, which is used as the base board, is patterned to thus have a desired circuit pattern 101a, as necessary (see FIG. 1J).

Although the upper clad layer 109 is typically formed by layering a clad film in the vacuum atmosphere, it may be formed through any other known process, such as coating process, without limitation to the above specified process.

Referring to FIGS. 2A to 2I, a method of manufacturing a printed circuit board for an optical waveguide, according to a second preferred embodiment of the present invention, is described.

This second embodiment is substantially identical to the first embodiment, with the exception that the through-hole is formed in advance before the layering of a lower clad layer in a formation of an insulation layer having a through-hole. Therefore, a description thereof will be briefly provided below, obviating detail therefrom.

Figure 2A:
FIGS. 2A to 2I are process views illustrating a method of manufacturing a printed circuit board for an optical waveguide, according to a second preferred embodiment of the present invention.

First, a flexible copper clad laminate functioning as a base board is comprised of a copper layer 201 and a polyimide layer 202, and a lower clad layer 203 is formed on the polyimide layer 202 of the flexible copper clad laminate (see FIG. 2A).

Figure 2B:
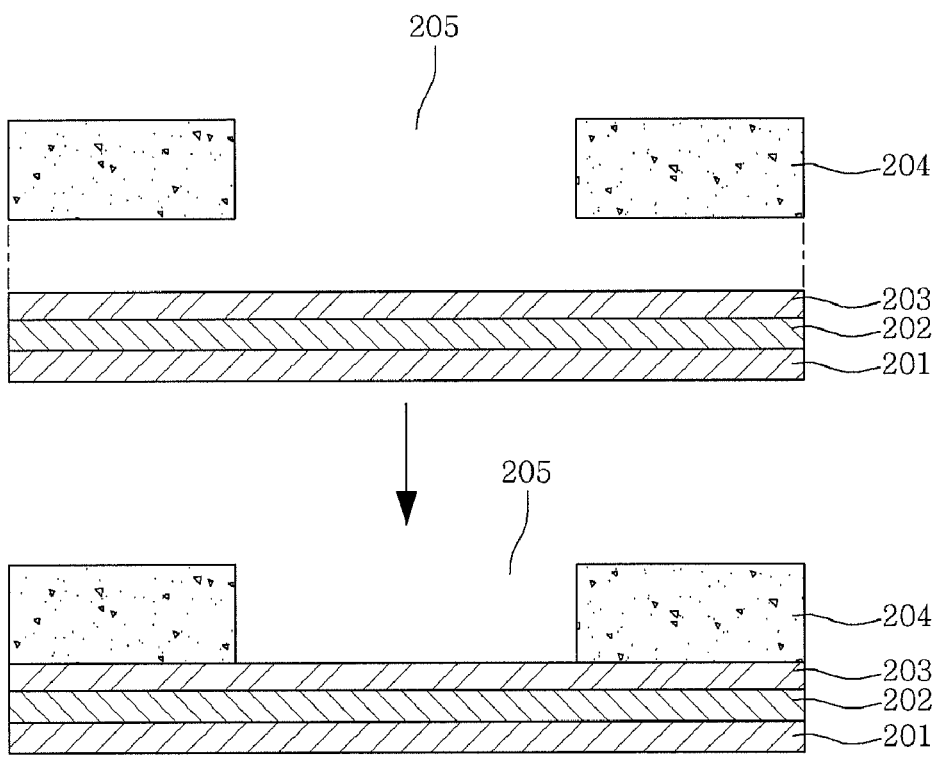

An insulation layer 204, having a plurality of through-holes 205 adapted to form cores, is prepared, and is then layered on the lower clad layer 203 (see FIG. 2B).

The process of forming the through-holes 205 in the insulation layer 204 is not particularly limited, but may be properly selected depending on the material of the insulation layer 204 which is actually used. For example, the through-holes 205 may be formed through a punching or a routing process.

Figure 2C:
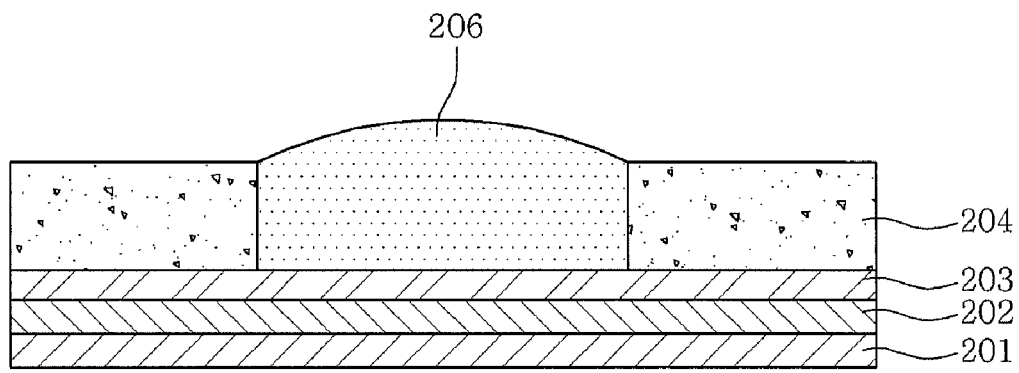

Subsequently, the through-hole 205 of the insulation layer 204 is filled with a core material 206 (see FIG. 2C).

Figure 2D:
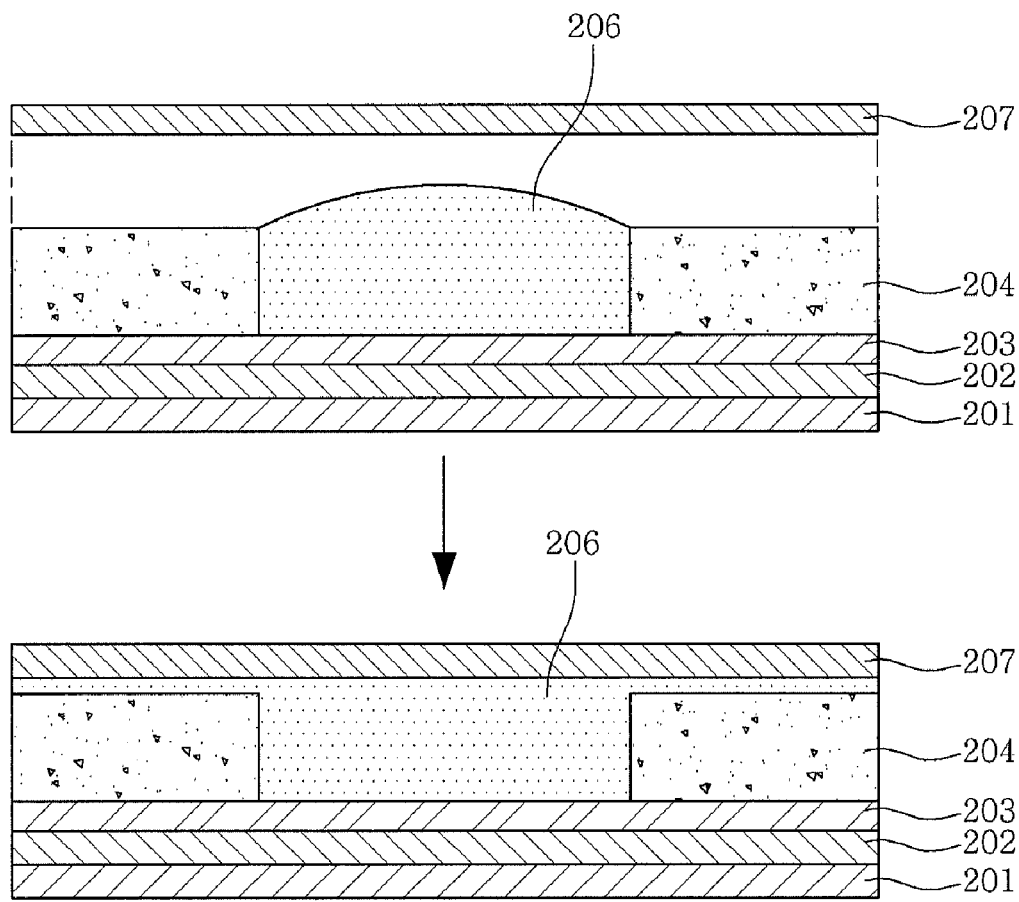
Figure 2E:
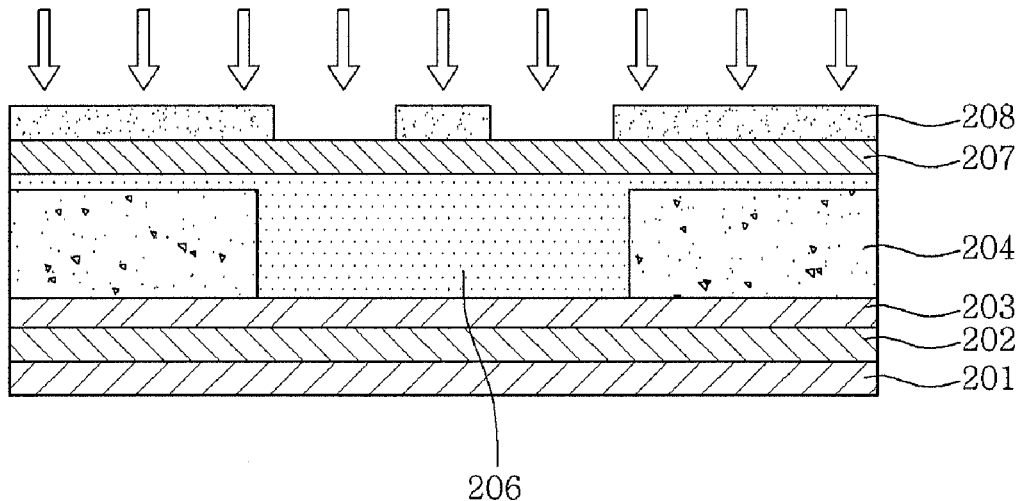
Figure 2F:
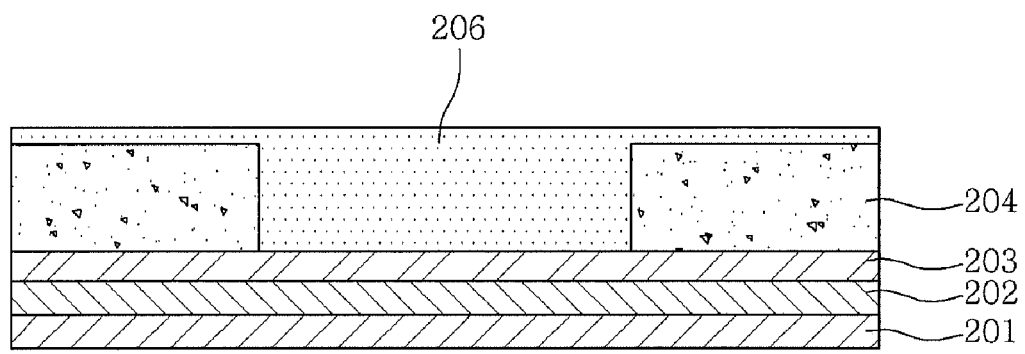
Figure 2G:
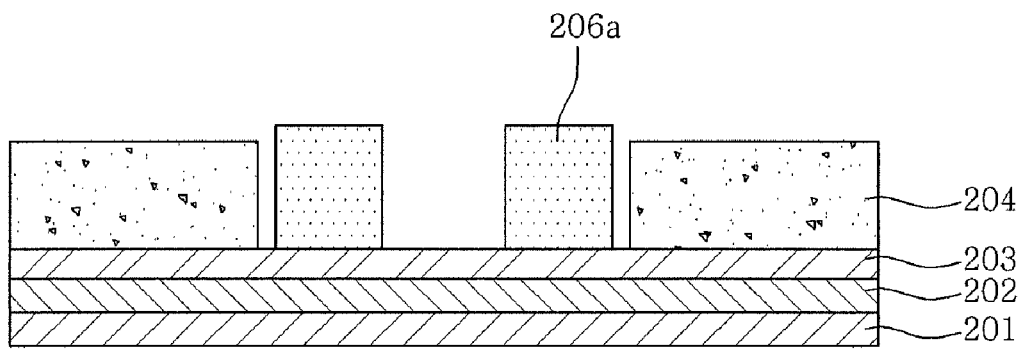

Then, the core material 206 charged in the through-hole 205 is subjected to a patterning process, thus forming a core part 206a (see FIG. 2G).

In the preferred embodiment, the formation of the core part 206a may be conducted in the manner described below.

First, a transparent releasable film 207 is layered on the insulation layer 204, having the through-hole 205 filled with the core material 206, in the vacuum atmosphere, so that the core material 206 charged in the through-hole 205 is flattened (see FIG. 2D).

Then, a pattern mask 208 having a predetermined patterning shape is placed on the transparent releasable film 207, so as to selectively expose the core material 206 to light (see FIG. 2E). At this point, post exposure baking (PEB) may be optionally conducted before or after the light exposure, if necessary.

Subsequently, the transparent releasable film 207 is removed (see FIG. 2F), and the core material 206, which is exposed to light, is developed, to thus form a plurality of core parts 206a (see FIG. 2G). The core parts 206a, which are obtained using the above processes, may have a height which is equal to or higher than the height of the insulation layer 204, depending on the results of the charging of the core material and the flattening process.

Figure 2H:
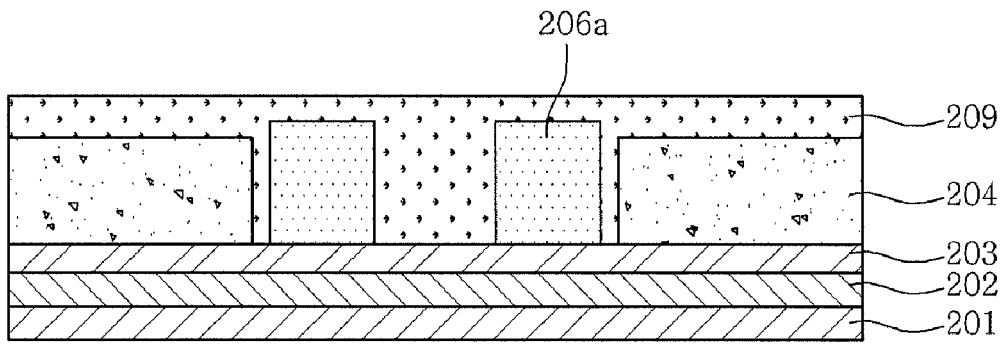
Figure 2I:
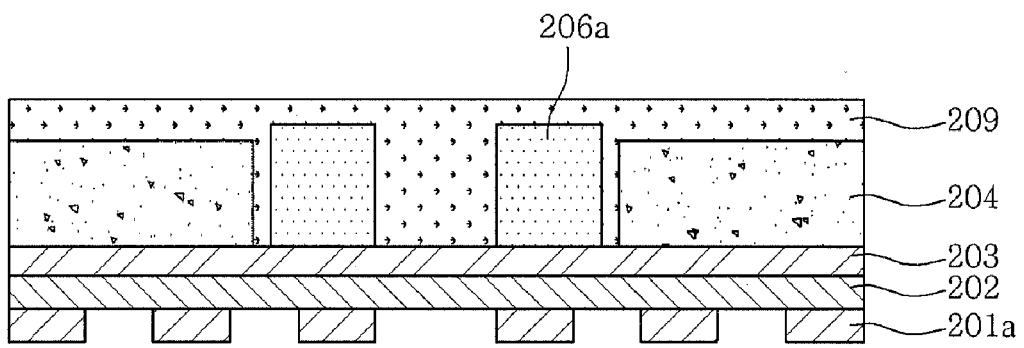

Finally, an upper clad layer 209 is applied in the rest through-hole 205 except for the core part 206a and on the insulation layer 204 (see FIG. 2H). Thereafter, the copper layer 201 of the flexible copper clad laminate, which is used as the base board, is patterned to thus have a desired circuit pattern 201a, as necessary (see FIG. 2I).

Referring to FIGS. 3A to 3K, a method of manufacturing a printed circuit board for an optical waveguide, according to a third preferred embodiment of the present invention, is described.

This third embodiment is conducted in the same process as those of the above first and second embodiments, with the exception that a molding film having a through-hole is used to form a core, and is then removed after the formation of the core, by which no molding film remains on the final product, unlike the first and second embodiments, in which the insulation layer having the through-hole adapted to form the core is used and remains on the final product. Therefore, a description thereof will be briefly provided hereinafter, without a detailed description thereof.

Figure 3A:
FIGS. 3A to 3K are process views illustrating a method of manufacturing a printed circuit board for an optical waveguide, according to a third preferred embodiment of the present invention.
Figure 3B:
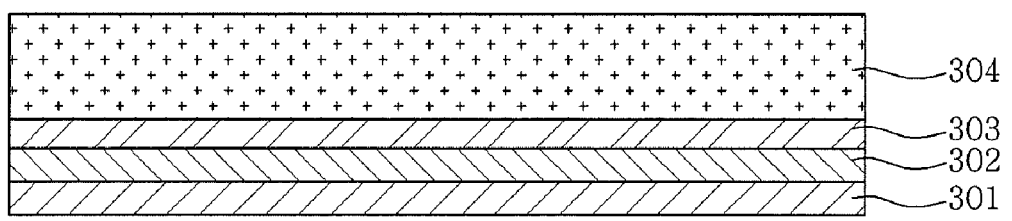

First, a flexible copper clad laminate functioning as a base board is comprised of a copper layer 301 and a polyimide layer 302, and a lower clad layer 303 is formed on the polyimide layer 302 of the flexible copper clad laminate (see FIG. 3A).

Figure 3C:
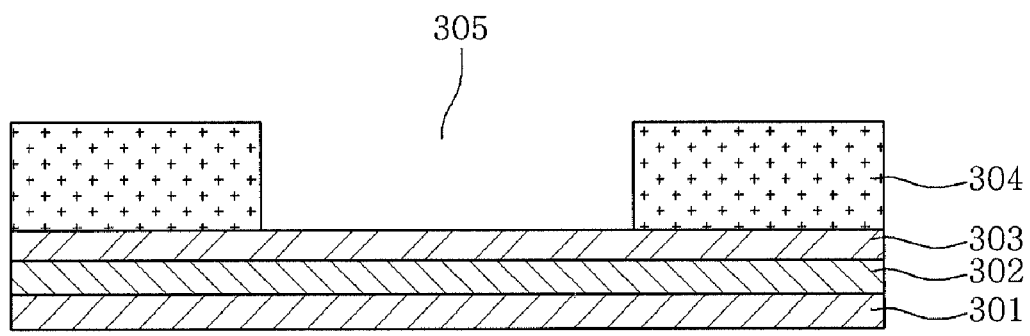

An molding film 304, having a through-hole 305 adapted to form a core, is prepared, and is then layered on the lower clad layer 303 (see FIG. 3C).

Preferably, a molding film 304, which is easy to remove, is layered on the lower clad layer 303 (see FIG. 3B), and then a predetermined portion adapted to form a core is removed from the molding film 304, thus providing a through-hole 305 (see FIG. 3C).

The molding film 304 may include, but is not limited to, a typical photo-sensitive film such as a dry film, and a releasable film, so that it is easily removed in the subsequent process.

The process of forming the through-hole 305 in the molding film 304 is not particularly limited, but may be properly selected depending on the material of the molding film that is actually used. For example, in case of using a dry film, the through-hole of the molding film may be formed by locally removing the molding film through a usual photo-etching process using light exposure/development.

Figure 3D:
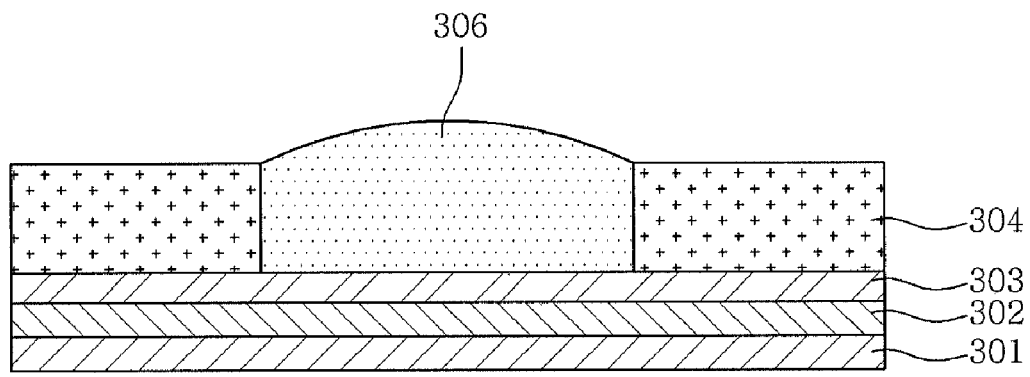

Subsequently, the through-hole 305 of the molding film 304 is filled with a core material 306 (see FIG. 3D).

Figure 3E:
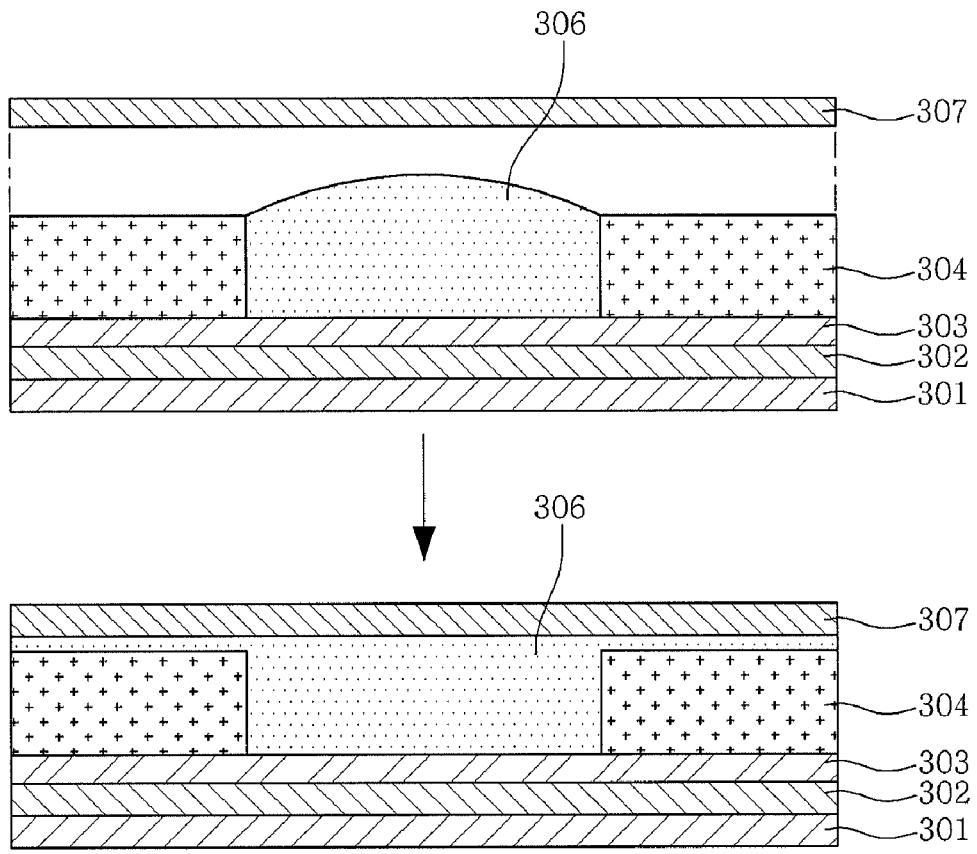
Figure 3F:
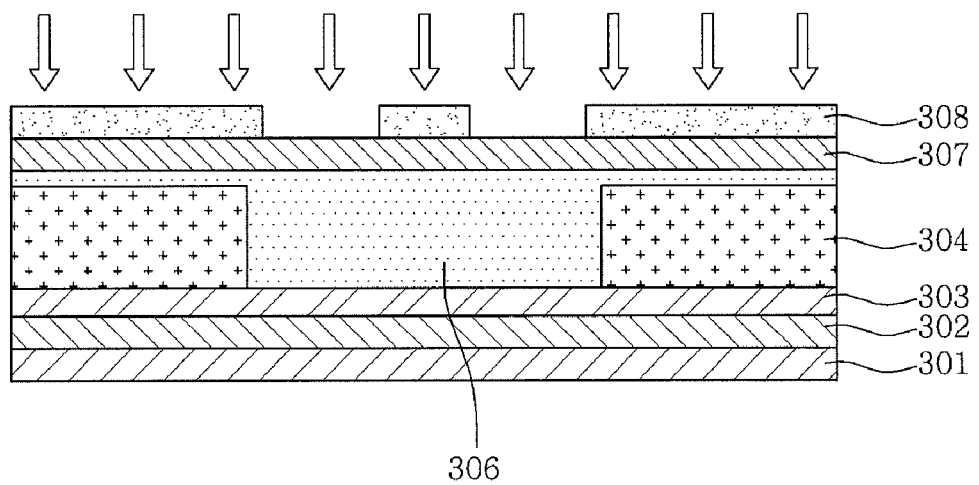
Figure 3G:
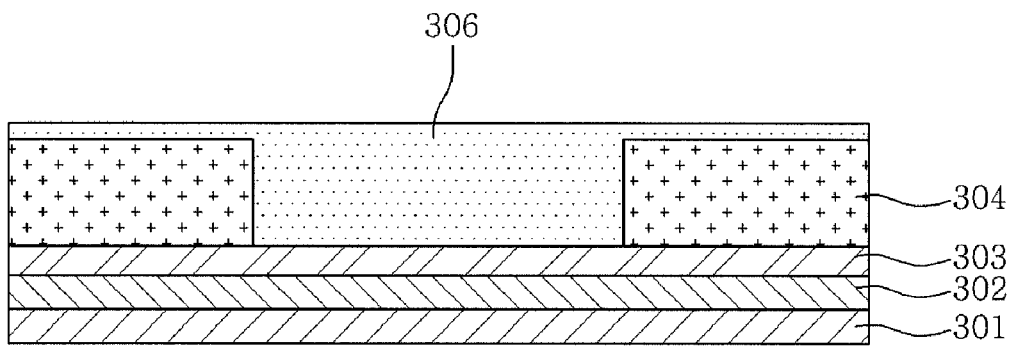
Figure 3H:
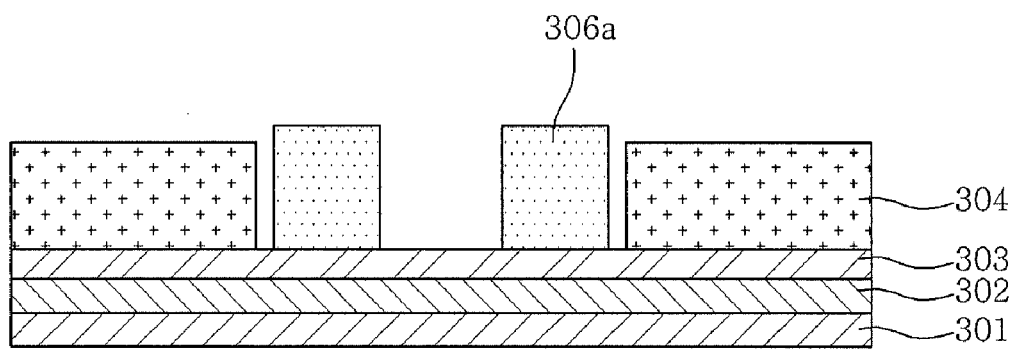

Then, the core material 306 charged in the through-hole 305 is subjected to a patterning process, thus forming a core part 306a (see FIG. 3H).

In the preferred embodiment, the formation of the core part 306a may be conducted in the manner described below.

First, a transparent releasable film 307 is layered on the molding film 304, having the through-hole 305 filled with the core material 306, in the vacuum atmosphere, so that the core material 306 charged in the through-hole 305 is flattened (see FIG. 3E). As the transparent releasable film 307 used in this process, any material that functions to prevent contamination caused by extraneous substances and to flatten the core material, and that further functions to allow transmission of light in the subsequent light exposure process and to allow easy elimination thereof after the light exposure, may be used without limitation. For example, polyethylene terephthalate (PET) may be preferably used.

Then, a pattern mask 308 having a predetermined patterning shape is placed on the transparent releasable film 307, so as to selectively expose the core material 306 to light (see FIG. 3F). At this point, post exposure baking (PEB) may optionally be conducted before or after the light exposure, if necessary.

Subsequently, the transparent releasable film 307 is removed (see FIG. 3G), and the core material 306, which is exposed to light, is developed, to thus form a plurality of core parts 306a (see FIG. 3H).

Figure 3I:
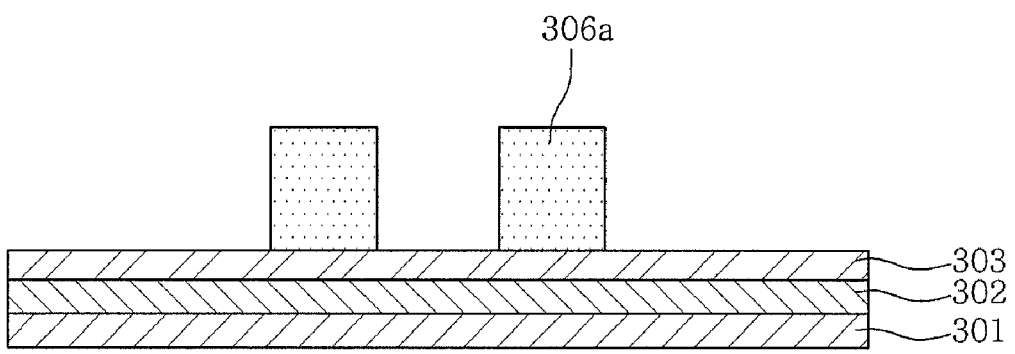

After the formation of the core part 306a through the patterning of the core material 306, the molding film 304 is removed (see FIG. 3I). The process of removing the molding film 304 may be properly selected depending on the material of the molding film 304 that is actually used. For example, in the case of using a dry film, the dry film may be removed using a stripping technique known in the art.

Figure 3J:
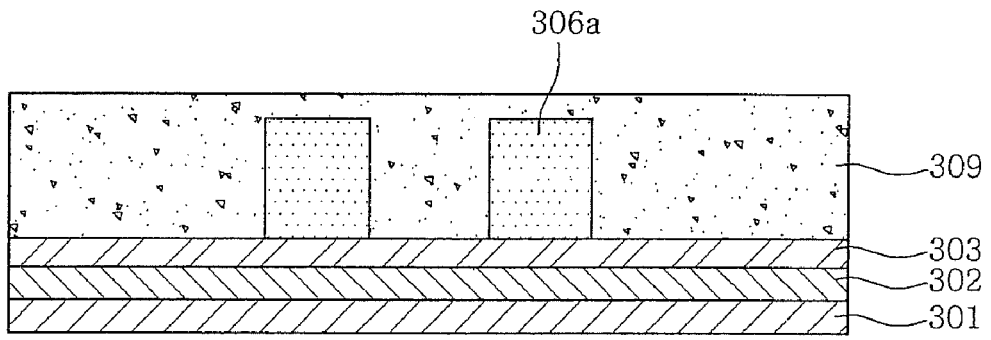
Figure 3K:
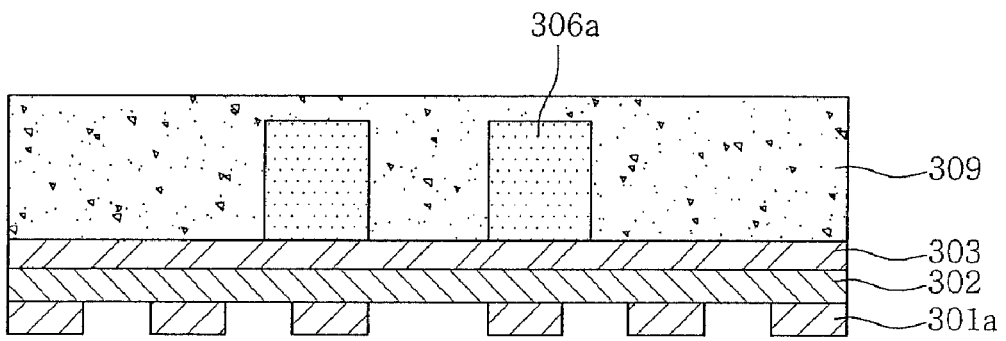
Figure 4A:
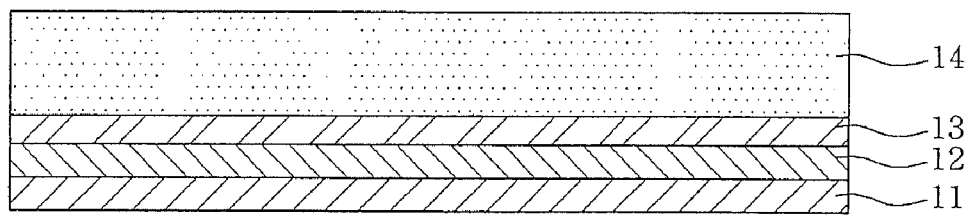
FIGS. 4A to 4C are process views illustrating a conventional method of manufacturing a printed circuit board for an optical waveguide.
Figure 4B:
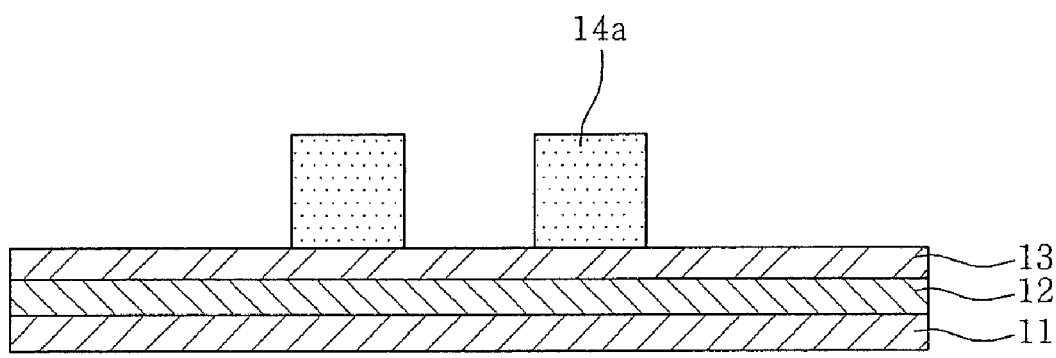
Figure 4C:
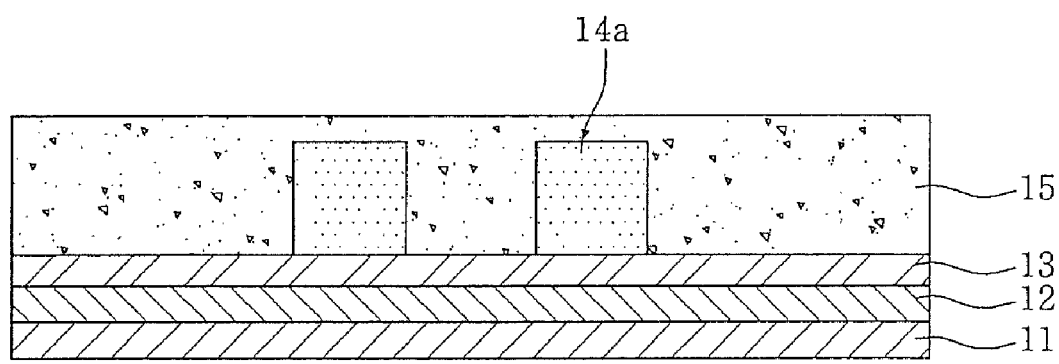

Finally, an upper clad layer 309 is applied on the lower clad layer 303 such that the upper clad layer 309 surrounds the core part 306a (see FIG. 3J). Thereafter, the copper layer 301 of the flexible copper clad laminate, which is used as the base board, is patterned to thus have a desired circuit pattern 301a, if necessary (see FIG. 3K).

Although the upper clad layer 309 is typically formed through layering of a clad film in the vacuum atmosphere, the process of forming the upper clad layer is not limited thereto, but may be formed using any known process, such as coating.

As described above, according to the present invention, a core material is applied on only a restricted region, i.e., in only a through-hole of a core-forming member, without the application of core material to the entire work size of a printed circuit board, and is patterned to thus form a core part. As a result, the amount of core material can be reduced to about 1/10 to 1/50 of the amount of core material used in a conventional method, thus improving economic efficiency.

Further, the invention is advantageous in that the member having the through-hole is constructed using a material that is typically used in the manufacture of printed circuit boards, and is then removed during the manufacturing process or remains on the final product, thus enabling somewhat free selection of materials for products and the free design of products.

In addition, thanks to the use of the insulation member having the through-hole and the use of the optional transparent releasable film, the present invention enables the formation of more precise and fine core parts and can avoid the deteriorations of optical properties due to poor flatness of the core part and the infiltration of extraneous substances, thus enabling the efficient production of a highly reliable printed circuit board for an optical waveguide.

Although the preferred embodiments of the present invention have been disclosed for illustrative purposes, a printed circuit board for an optical waveguide and a method of manufacturing the same, according to the present invention, is not limited to these embodiments, and those skilled in the art will appreciate that various modifications, additions and substitutions are possible, without departing from the scope and spirit of the invention as disclosed in the accompanying claims.

Simple changes and modifications of the present invention also fall within the scope of the present invention, and the true scope of protection of the present invention will be defined by the accompanying claims.

What is claimed is:

1. A method of manufacturing a printed circuit board for an optical waveguide, comprising:
    forming a lower clad layer on a base board;
    forming an insulation layer, having a core-forming through-hole therein, on the lower clad layer;
    filling the through-hole in the insulation layer with a core material;
    forming a core part by patterning the core material received in the through-hole; and
    forming an upper clad layer in the rest through-hole except for the core part and on the insulation layer.

2. The method according to claim 1, wherein the forming the core part comprises:
    layering a transparent releasable film on the insulation layer having the through-hole filled with the core material, to thus flatten the core material;
    selectively exposing the core material through a pattern mask; and
    removing the transparent releasable film and developing the exposed core material, thus forming a plurality of core patterns.

3. The method according to claim 2, wherein the transparent releasable film includes polyethylene terephthalate.

4. The method according to claim 1, wherein the forming an insulation layer comprises:
    layering the insulation layer on the lower clad layer; and
    removing a portion of the insulation layer to form the core-forming through-hole.

5. The method according to claim 1, wherein the forming an insulation layer comprises:
    preparing the insulation layer;
    removing a portion of the insulation layer to form the core-forming through-hole; and
    layering the insulation layer having the core-forming through-hole on the lower clad layer.

6. The method according to claim 1, wherein the base board includes any one of a metal layer for forming a circuit, a rigid printed circuit board, a flexible printed circuit board and a rigid-flexible printed circuit board.

7. The method according to claim 1, wherein the insulation layer is selected from a group consisting of a thermosetting resin, a thermoplastic resin, a reinforcing material-impregnated thermosetting resin, a reinforcing material-impregnated thermoplastic resin, and a combination thereof.

8. A method of manufacturing a printed circuit board for an optical waveguide, comprising:
    forming a lower clad layer on a base board;
    forming a molding film, having a core-forming through-hole therein, on the lower clad layer;
    filling the through-hole in the molding film with a core material;
    forming a core part by patterning the core material received in the through-hole;
    removing the molding film; and
    forming an upper clad layer on the lower clad layer such that the upper clad layer surrounds the core part.

9. The method according to claim 8, wherein the forming a core part comprises:
    layering a transparent releasable film on the molding film having the through-hole filled with the core material, to thus flatten the core material;
    selectively exposing the core material through a pattern mask; and
    removing the transparent releasable film and developing the exposed core material, thus forming a plurality of core patterns.

10. The method according to claim 9, wherein the transparent releasable film includes polyethylene terephthalate.

11. The method according to claim 8, wherein the forming a molding film comprises:
    layering the molding film on the lower clad layer; and
    removing a portion of the molding film to form the core-forming through-hole.

12. The method according to claim 8, wherein the base board includes any one of a metal layer for forming a circuit, a rigid printed circuit board, a flexible printed circuit board and a rigid-flexible printed circuit board.

13. The method according to claim 8, wherein the molding film includes a photo-sensitive resist film.

14. The method according to claim 8, wherein the molding film includes a releasable film.

* * * * *